US012690154B2

(12) United States Patent
Tsai et al.

(10) Patent No.: US 12,690,154 B2
(45) Date of Patent: Jul. 21, 2026

(54) EXPANSION CARD FRAME ASSEMBLY, EXPANSION CARD MODULE AND ELECTRONIC DEVICE

(71) Applicant: Wiwynn Corporation, New Taipei City (TW)

(72) Inventors: Cheng-Yao Tsai, New Taipei City (TW); Wei Chen Lin, New Taipei City (TW); Ping Sheng Yeh, New Taipei City (TW); Yen-Hsiang Wang, New Taipei City (TW); Yi-Shen Chen, New Taipei City (TW)

(73) Assignee: WIWYNN CORPORATION, New Taipei City (TW)

( * ) Notice: Subject to any disclaimer, the term of this patent is extended or adjusted under 35 U.S.C. 154(b) by 220 days.

(21) Appl. No.: 18/362,061

(22) Filed: Jul. 31, 2023

(65) Prior Publication Data

US 2024/0381561 A1 Nov. 14, 2024

(30) Foreign Application Priority Data

May 10, 2023 (TW) .................................. 112117366

(51) Int. Cl.
*H05K 7/14* (2006.01)
*G06F 1/185* (2026.01)

(52) U.S. Cl.
CPC ........... *H05K 7/1489* (2013.01); *G06F 1/185* (2013.01); *H05K 7/1487* (2013.01)

(58) Field of Classification Search
CPC .. H05K 7/1402; H05K 7/1404; H05K 7/1405; H05K 7/1408; H05K 7/1424; H05K 7/1425; H05K 7/1431; H05K 7/1485; H05K 7/1487; H05K 7/1488; H05K 7/1489; H05K 7/1491; H05K 5/0217; H05K 5/30; H05K 5/0286; H05K 5/0291; H05K 5/0221; G06F 1/16; G06F 1/181; G06F 1/183; G06F 1/185; G06F 1/186; G06F 1/187;

(Continued)

(56) References Cited

U.S. PATENT DOCUMENTS 5,623,396 A * 4/1997 Blackwell ............ H05K 7/1405
361/801
6,174,189 B1 * 1/2001 Kuo ..................... H05K 7/1405
439/61

(Continued)

FOREIGN PATENT DOCUMENTS

CN 213457914 U 6/2021
CN 218213985 U * 1/2023
TW 201516621 A 5/2015

*Primary Examiner* — Gage Crum
(74) *Attorney, Agent, or Firm* — McClure, Qualey & Rodack, LLP

(57) ABSTRACT

An expansion card frame assembly is configured to support a riser card and an expansion card. The expansion card frame assembly includes a frame, a pivotable component and a stopper. The frame is configured to support the riser card, and the expansion card is configured to be inserted into the riser card. The pivotable component is pivotably disposed on the frame and configured to be located aside the expansion card. The stopper is movably disposed on the pivotable component and configured to be located at one side of the expansion card which is located farther away from the riser card.

20 Claims, 8 Drawing Sheets

(58) Field of Classification Search
CPC ... G06F 15/16; G06F 15/161; H01R 12/7029; H01R 12/7023; H01R 12/7058; H01R 12/721; H01R 12/737; H01R 13/6275; H01R 13/639; H01R 4/50; H01R 43/26; H01R 13/629
See application file for complete search history.

(56) References Cited

U.S. PATENT DOCUMENTS

| | | | | |
|---|---|---|---|---|
| 6,442,037 B1 * | 8/2002 | Boe | H05K 7/1408 | 361/801 |
| 7,359,216 B2 * | 4/2008 | Hall | G06F 1/185 | 361/752 |
| 7,724,537 B1 * | 5/2010 | Grantham | H05K 7/1407 | 361/801 |
| 7,933,129 B2 * | 4/2011 | Chen | G06F 1/185 | 361/801 |
| 8,837,135 B2 * | 9/2014 | Zheng | G06F 1/186 | 361/801 |
| 9,310,853 B2 | 4/2016 | Yu | | |
| 9,524,001 B2 * | 12/2016 | Liu | H05K 7/1487 | |
| 10,973,139 B1 * | 4/2021 | Tsorng | H05K 7/1424 | |
| 11,262,812 B2 * | 3/2022 | Chen | G06F 1/186 | |
| 2004/0190228 A1 * | 9/2004 | Shi | H05K 7/1408 | 361/539 |
| 2009/0002960 A1 * | 1/2009 | Liu | G06F 1/185 | 361/759 |
| 2012/0155007 A1 * | 6/2012 | Zhang | H05K 5/0269 | 361/679.32 |
| 2012/0281373 A1 * | 11/2012 | Bohannon | H05K 7/1489 | 361/756 |
| 2013/0070421 A1 * | 3/2013 | Zhou | H05K 7/1417 | 361/724 |
| 2013/0107441 A1 * | 5/2013 | Zhou | G06F 1/185 | 248/298.1 |
| 2013/0148286 A1 * | 6/2013 | Liu | G06F 1/185 | 248/225.21 |
| 2014/0049901 A1 * | 2/2014 | Zhu | H05K 7/1418 | 361/679.32 |
| 2014/0168910 A1 * | 6/2014 | Yin | G06F 1/186 | 361/747 |
| 2015/0115120 A1 * | 4/2015 | Yu | G06F 1/186 | 248/220.21 |
| 2019/0075667 A1 * | 3/2019 | Ehlen | H05K 5/0221 | |
| 2022/0114130 A1 * | 4/2022 | Lin | G06F 13/4221 | |
| 2022/0117111 A1 * | 4/2022 | Tseng | G06F 1/186 | |
| 2023/0103941 A1 * | 4/2023 | Tsorng | H05K 7/1487 | 361/679.01 |
| 2024/0164043 A1 * | 5/2024 | Tsorng | G06F 1/185 | |

* cited by examiner

EXPANSION CARD FRAME ASSEMBLY, EXPANSION CARD MODULE AND ELECTRONIC DEVICE

CROSS-REFERENCE TO RELATED APPLICATIONS

This non-provisional application claims priority under 35 U.S.C. § 119 (a) on Patent Application No(s). 112117366 filed in Taiwan, R.O.C. on May 10, 2023, the entire contents of which are hereby incorporated by reference.

TECHNICAL FIELD

The disclosure relates to an expansion card frame assembly, an expansion card module and an electronic device.

BACKGROUND

In general, when an expansion card is installed on a riser card disposed on an expansion card frame assembly, a front end of the expansion card may be further fixed to the expansion card frame assembly via screws. Since there is no structure or means to fix a rear end of the expansion card, the expansion card may be easily swayed and thus detached from the riser card in a shock and vibration testing, causing the testing failure.

In order to solve the aforementioned issue, the expansion card frame assembly is provided with a limiting structure located aside the expansion card and extending to the rear end of the expansion card, and the limiting structure has a limiting groove configured to be engaged with an edge of the expansion card for preventing the expansion card from swaying or oscillating. However, during the removal of the expansion card, the edge of the expansion card is required to slide out of the limiting groove for finishing the removal of the expansion card, such that the limiting structure may easily scratch the expansion card, and the limiting structure may be interfered with electronic components of the expansion card located near the edge of the expansion card. Therefore, how to solve the aforementioned issues is one of the crucial topics in this field.

SUMMARY

One embodiment of the disclosure provides an expansion card frame assembly. The expansion card frame assembly is configured to support a riser card and an expansion card. The expansion card frame assembly includes a frame, a pivotable component and a stopper. The frame is configured to support the riser card, and the expansion card is configured to be inserted into the riser card. The pivotable component is pivotably disposed on the frame and configured to be located aside the expansion card. The stopper is movably disposed on the pivotable component and configured to be located at one side of the expansion card which is located farther away from the riser card.

Another embodiment of the disclosure provides an expansion card module. The expansion card module includes an expansion card frame assembly, a riser card and an expansion card. The expansion card frame assembly includes a frame, a pivotable component and a stopper. The pivotable component is pivotably disposed on the frame. The stopper is movably disposed on the pivotable component. The riser card is supported by the frame. The expansion card is inserted into the riser card. The pivotable component is located aside the expansion card, and the stopper is located at one side of the expansion card located farther away from the riser card.

Still another embodiment of the disclosure provides an electronic device. The electronic device includes a casing, a motherboard and an expansion card module. The casing has an accommodation space. The motherboard is located in the accommodation space of the casing. The expansion card module is mounted on the motherboard and includes an expansion card frame assembly, a riser card and an expansion card. The pivotable component is pivotably disposed on the frame. The stopper is movably disposed on the pivotable component. The riser card is supported by the frame. The expansion card is inserted into the riser card. The pivotable component is located aside the expansion card, and the stopper is located at one side of the expansion card located farther away from the riser card.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
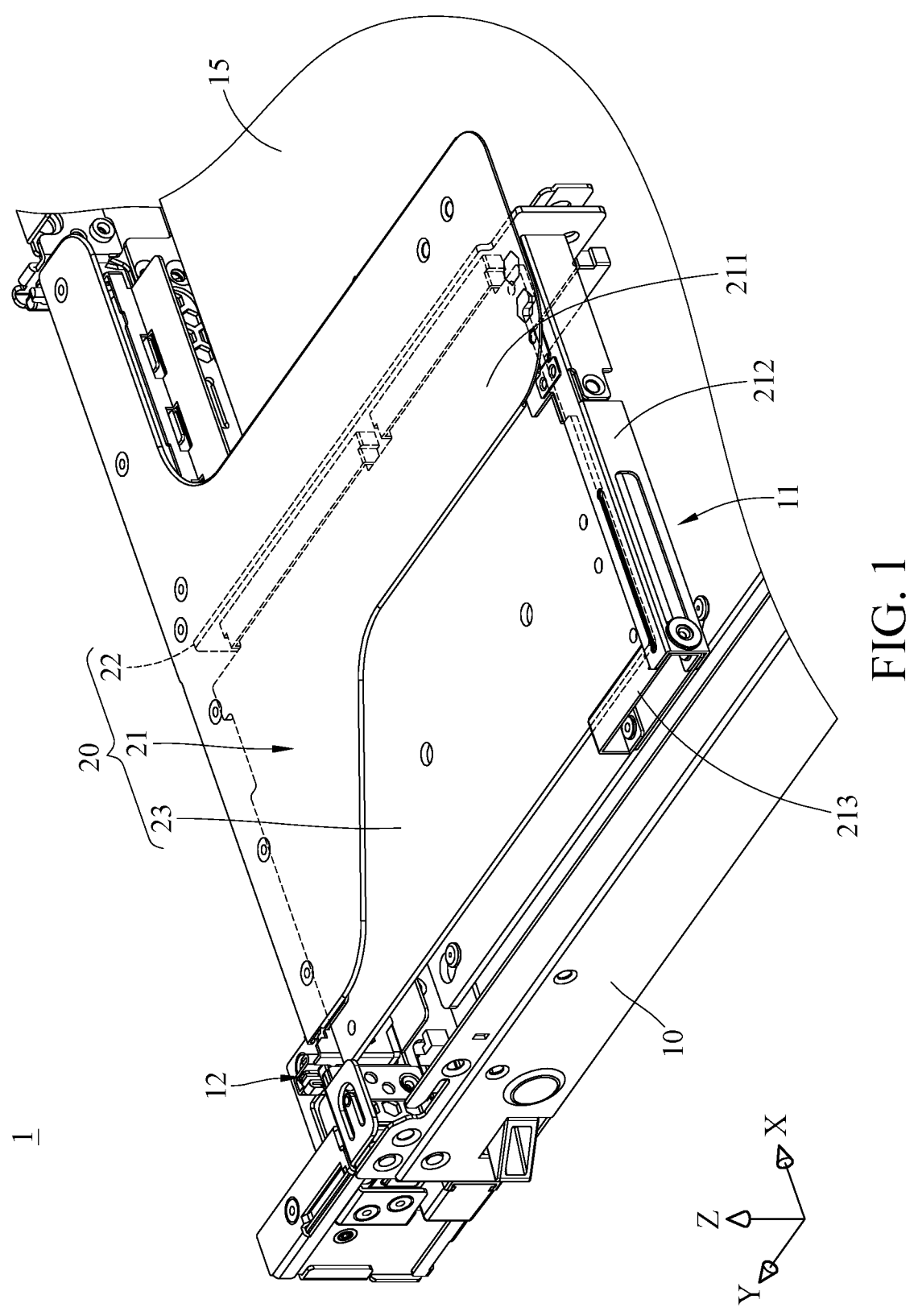
FIG. 1 is a partial perspective view of an electronic device according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
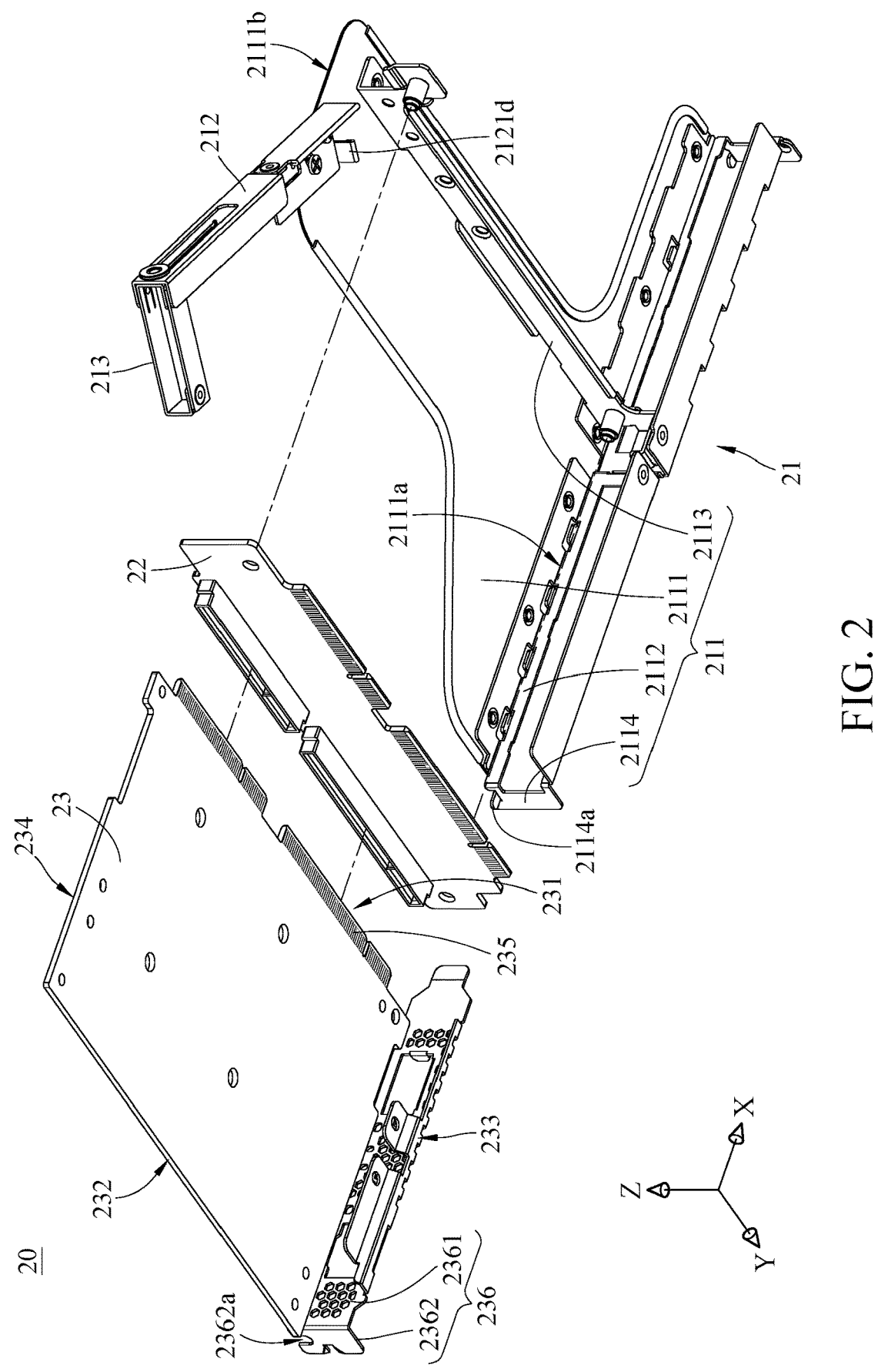
FIG. 2 is an exploded view of an expansion card module in FIG. 1.
Figure 3:
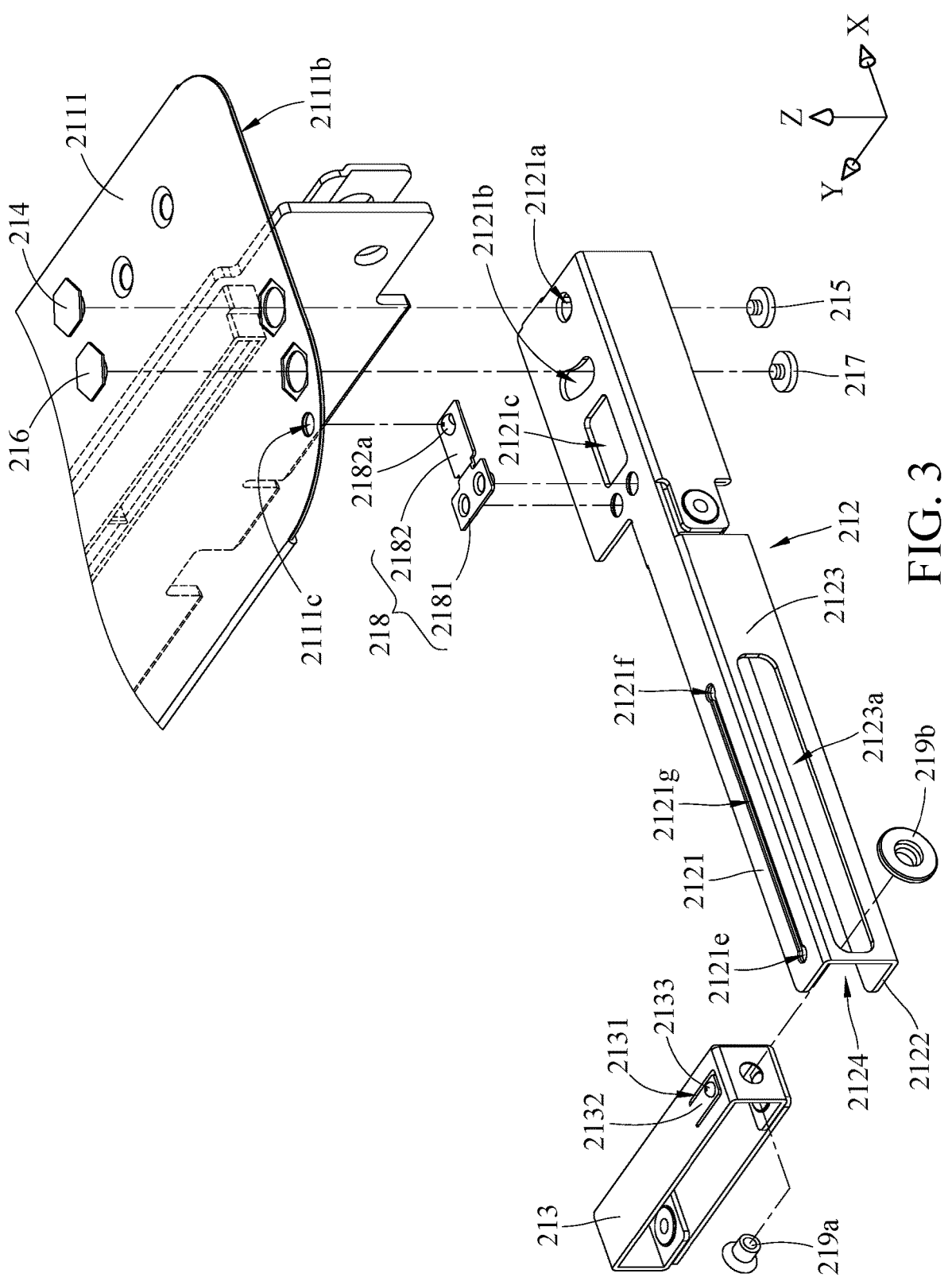
FIG. 3 is a partial exploded view of an expansion card frame assembly in FIG. 1.

Referring to FIGS. 1 to 3, FIG. 1 is a partial perspective view of an electronic device 1 according to one embodiment of the disclosure, FIG. 2 is an exploded view of an expansion card module 20 in FIG. 1, and FIG. 3 is a partial exploded view of an expansion card frame assembly 21 in FIG. 1.

In this embodiment, the electronic device 1 is, for example, a server. The electronic device 1 includes a casing 10, a motherboard 15 and an expansion card module 20. In addition, the electronic device 1 may further include a plurality of hard disk drives, a plurality of fans, a power supply and so on. In order to clearly show the structure of the expansion card module 20 of the electronic device 1, the aforementioned components are omitted in the figures.

In this embodiment, the casing 10 has an accommodation space 11 and a positioning recess 12. The positioning recess 12 communicates with the accommodation space 11. The motherboard 15 is accommodated in the accommodation space 11 of the casing 10, and the expansion card module 20 is mounted on the motherboard 15.

Specifically, the expansion card module 20 includes an expansion card frame assembly 21, a riser card 22 and an expansion card 23. The expansion card frame assembly 21 includes a frame 211, a pivotable component 212 and a stopper 213.

The frame 211 includes a top plate portion 2111, a front frame portion 2112, a side frame portion 2113 and a positioning portion 2114. The top plate portion 2111 has a first side 2111a and a second side 2111b located opposite to each other. The front frame portion 2112 is connected to the first side 2111a of the top plate portion 2111, and the side frame portion 2113 is connected to the top plate portion 2111 and located between the first side 2111a and the second side 2111b of the top plate portion 2111. The positioning portion 2114 is connected to the front frame portion 2112 and extends towards a direction away from the second side 2111b of the top plate portion 2111. The top plate portion 2111, the front frame portion 2112 and the side frame portion 2113 of the frame 211 are located in the accommodation space 11 of the casing 10, and the positioning portion 2114 of the frame 211 is located in the positioning recess 12. The positioning portion 2114 has a tab structure 2114a. The riser card 22 is fixed to the side frame portion 2113, and the riser card 22 is inserted into the motherboard 15. The expansion card 23 is, for example, a full-height expansion card 23. The expansion card 23 has a first side 231, a second side 232, a third side 233, a fourth side 234, an electrical connection portion 235 and a bracket 236. The first side 231 and the second side 232 of the expansion card 23 are located opposite to each other, and the third side 233 and the fourth side 234 are located opposite to each other and are located adjacent to the first side 231 and the second side 232. The electrical connection portion 235 is, for example, a golden finger. The electrical connection portion 235 is located at the first side 231. The bracket 236 is located at the third side 233, and the bracket 236 has a flat portion 2361 and a bent portion 2362. The electrical connection portion 235 of the expansion card 23 is inserted into the riser card 22. The flat portion 2361 of the bracket 236 of the expansion card 23 is supported by the front frame portion 2112 of the frame 211. The bent portion 2362 of the bracket 236 of the expansion card 23 is located in the positioning recess 12 of the casing 10 and is supported by the positioning portion 2114 of the frame 211. The bent portion 2362 has a positioning notch 2362a, and the tab structure 2114a of the positioning portion 2114 is located in the positioning notch 2362a. As a result, the expansion card module 20 is positioned in the positioning recess 12 of the casing 10.

Figure 4:
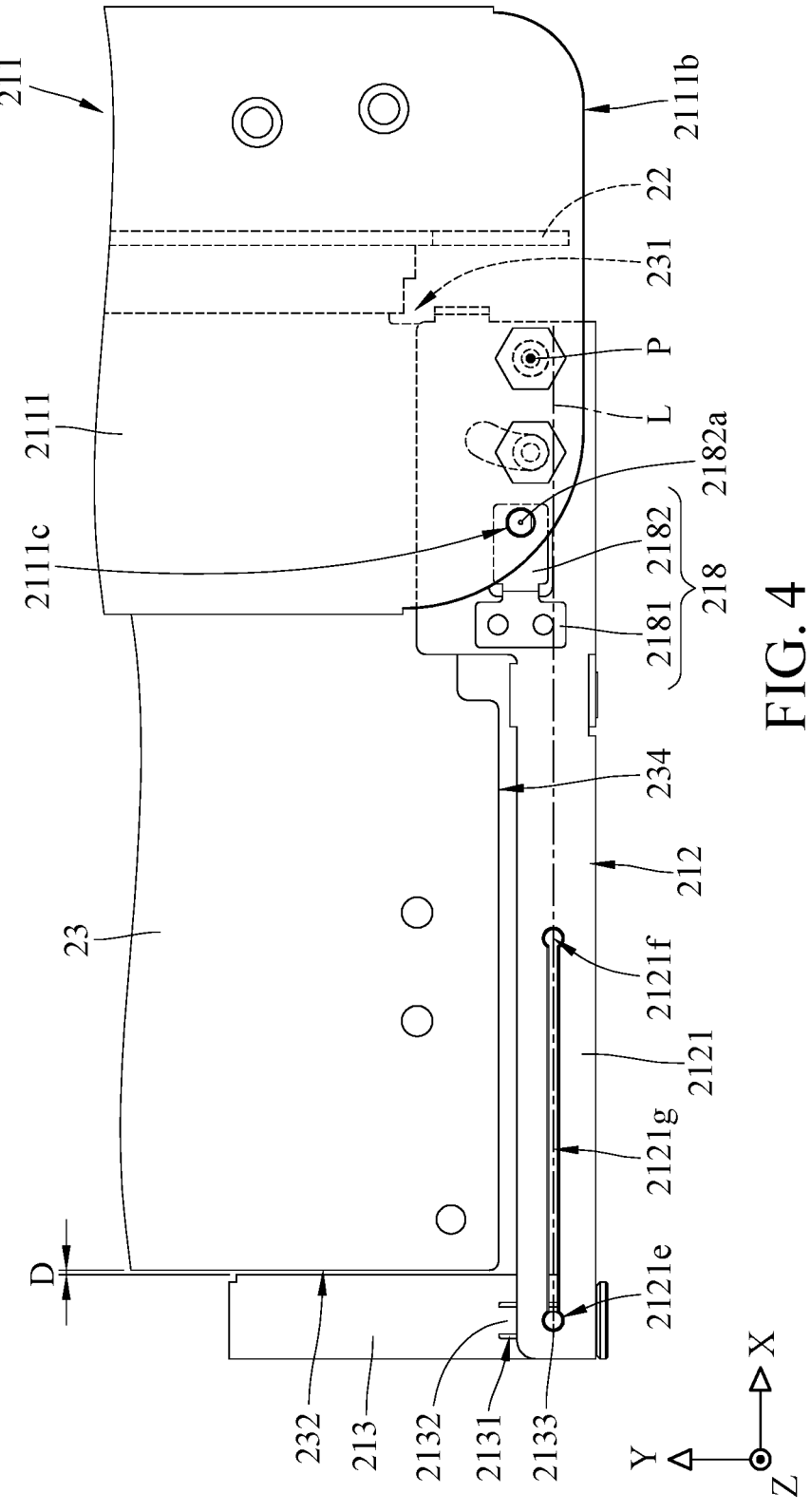
FIG. 4 is a partial top view of the expansion card module in FIG. 1.
Figure 5:
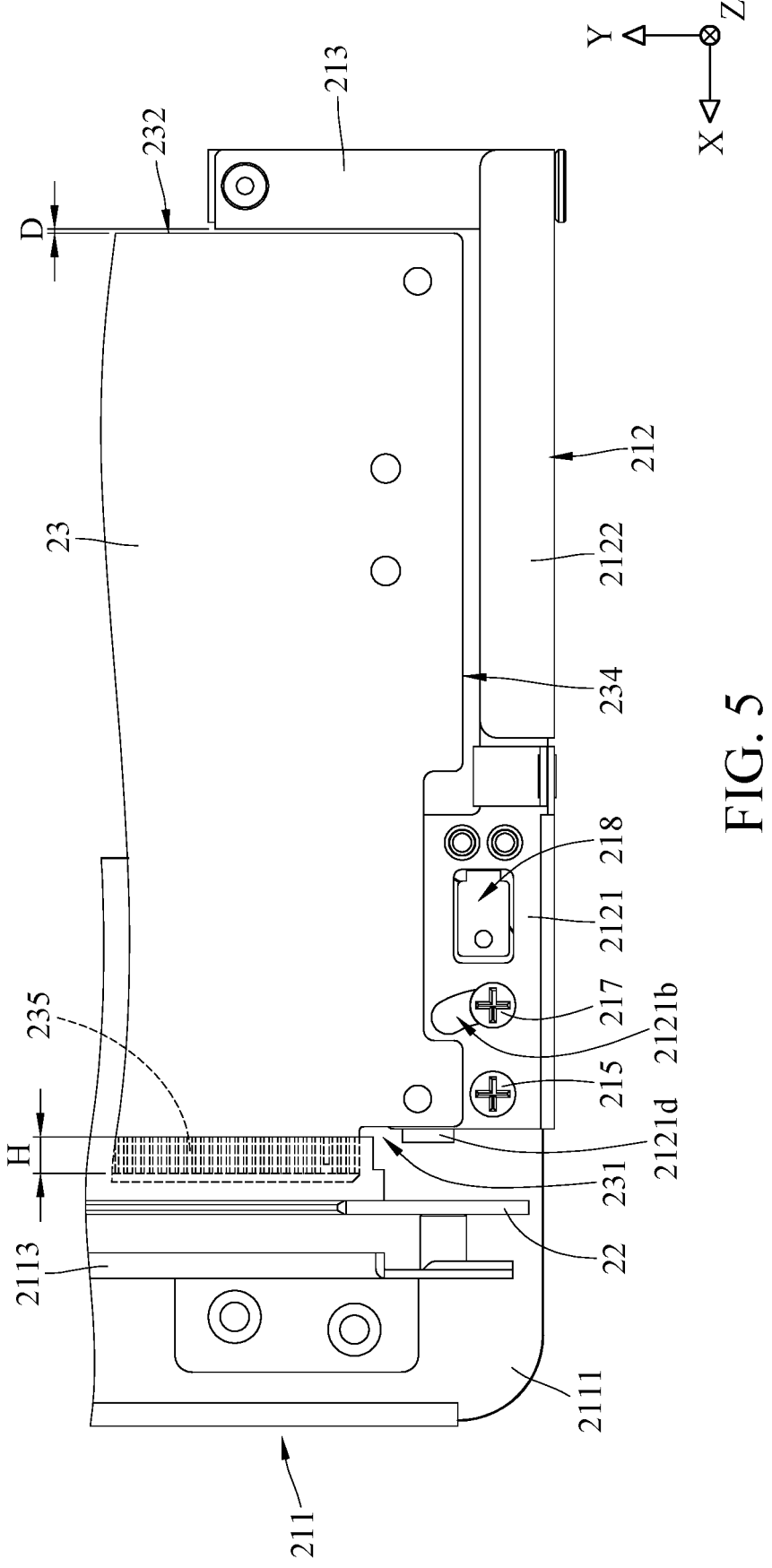
FIG. 5 is a partial bottom view of the expansion card module in FIG. 1.

Then, referring to FIGS. 3 to 5, FIG. 4 is a partial top view of the expansion card module 20 in FIG. 1, and FIG. 5 is a partial bottom view of the expansion card module 20 in FIG. 1.

The pivotable component 212 is pivotably disposed on the second side 2111b of the top plate portion 2111 and is located aside the fourth side 234 of the expansion card 23. Specifically, the pivotable component 212 includes a first horizontal plate 2121, a second horizontal plate 2122 and a vertical plate 2123. The first horizontal plate 2121 and the second horizontal plate 2122 are respectively connected to two opposite ends of the vertical plate 2123 and extend towards the same direction, and the first horizontal plate 2121 is located closer to the top plate portion 2111 of the frame 211 than the second horizontal plate 2122. The first horizontal plate 2121 may have a shaft hole 2121a, and the expansion card frame assembly 21 may further include an assembling component 214 and a mount component 215. The assembling component 214 is, for example, a rivet with a threaded hole, and the assembling component 214 is fixed on the second side 2111b of the top plate portion 2111 of the frame 211. The mount component 215 is, for example, a screw. The mount component 215 is disposed through the shaft hole 2121a of the first horizontal plate 2121 and is screwed into the assembling component 214, such that the pivotable component 212 is pivotable relative to the top plate portion 2111 of the frame 211.

Note that the pivotable component 212 is not restricted to being pivotably disposed on the top plate portion 2111 of the frame 211 via the mount component 215 and the assembling component 214; in some other embodiments, the pivotable component may be pivotably disposed on the top plate portion of the frame via other suitable components.

In this embodiment, the first horizontal plate 2121 of the pivotable component 212 may further have a curved slot 2121b, and the expansion card frame assembly 21 may further include another assembling component 216 and a positioning component 217. The assembling component 216 is, for example, a rivet with a threaded hole. The assembling component 216 is fixed on the second side 2111b of the top plate portion 2111 of the frame 211. The positioning component 217 is, for example, a screw. The positioning component 217 is disposed through the curved slot 2121b of the first horizontal plate 2121 and is partially located in the curved slot 2121b of the first horizontal plate 2121. The positioning component 217 is screwed into the assembling component 216. Therefore, the cooperation of the positioning component 217 and the curved slot 2121b of the first horizontal plate 2121 can limit the pivotable range or angle of the pivotable component 212.

Note that the curved slot 2121b of the first horizontal plate 2121, the assembling component 214 and the positioning component 217 are optional structures and components and may be omitted according to actual requirements.

In this embodiment, the top plate portion 2111 of the frame 211 may further have an engagement hole 2111c located at the second side 2111b. The first horizontal plate 2121 of the pivotable component 212 may further have an opening 2121c. In addition, the expansion card frame assembly 21 may further include an elastic engagement component 218. The elastic engagement component 218 includes a fixed portion 2181 and a movable portion 2182. The fixed portion 2181 is fixed to the first horizontal plate 2121 of the pivotable component 212, and the movable portion 2182 is movably located in the opening 2121c of the first horizontal plate 2121. The movable portion 2182 has an engagement protrusion 2182a, and the engagement protrusion 2182a is engaged with the engagement hole 2111c of the top plate portion 2111, such that the pivotable component 212 is fixed in position and is unable to be pivoted relative to the top plate portion 2111.

Note that the engagement hole 2111c of the top plate portion 2111 of the frame 211 and the elastic engagement component 218 are optional structures and components; in some other embodiments, the pivotable component may be fixed in position and unable to be pivoted relative to the top plate portion by other suitable structures and components.

In this embodiment, the first horizontal plate 2121 of the pivotable component 212 may further have a contact structure 2121d (as show in FIG. 5), and the contact structure 2121d is in contact with the first side 231 of the expansion card 23. The later paragraphs will illustrate the purpose of the contact structure 2121d.

In this embodiment, the first horizontal plate 2121, the second horizontal plate 2122 and the vertical plate 2123 together form a slide channel 2124. The vertical plate 2123 has a guide slot 2123a, and the guide slot 2123a communicates with the slide channel 2124. In addition, the expansion card frame assembly 21 may further include two fasteners 219a and 219b. The stopper 213 is slidably located in the slide channel 2124 and located adjacent to the second side 232 of the expansion card 23; that is, the stopper 213 and the contact structure 2121d of the first horizontal plate 2121 are respectively located at two opposite sides of the expansion card 23. One of the fasteners 219a is disposed through the stopper 213 and the guide slot 2123a of the vertical plate 2123 and is assembled with the other one of the fasteners 219b, such that the stopper 213 is held in the slide channel 2124 of the pivotable component 212 and is unable to be detached from the slide channel 2124.

Note that the guide slot 2123a of the vertical plate 2123 and the fasteners 219a and 219b are optional structures and components; in some other embodiments, the vertical plate may not have the guide slot, the expansion card frame assembly may not include the fasteners, and the stopper may be held in the slide channel of the pivotable component via other suitable structures and components.

In addition, the slide channel 2124 of the pivotable component 212 is not restricted to being formed by the first horizontal plate 2121, the second horizontal plate 2122 and the vertical plate 2123; in some other embodiments, the slide channel of the pivotable component may be merely formed by the first horizontal plate and the vertical plate, or merely formed by the second horizontal plate and the vertical plate.

In this embodiment, the first horizontal plate 2121 of the pivotable component 212 may further have a first engagement hole 2121e, a second engagement hole 2121f and a guide slot 2121g. The first engagement hole 2121e and the second engagement hole 2121f are respectively connected to two opposite ends of the guide slot 2121g, and the first engagement hole 2121e is located farther away from the riser card 22 than the second engagement hole 2121f. As shown in FIG. 4, a straight line L is defined to pass through a center of the first engagement hole 2121e and a center of the second engagement hole 2121f, and the straight line L is located farther away from the expansion card 23 than a pivotal axis P of the pivotable component 212.

Figure 8:
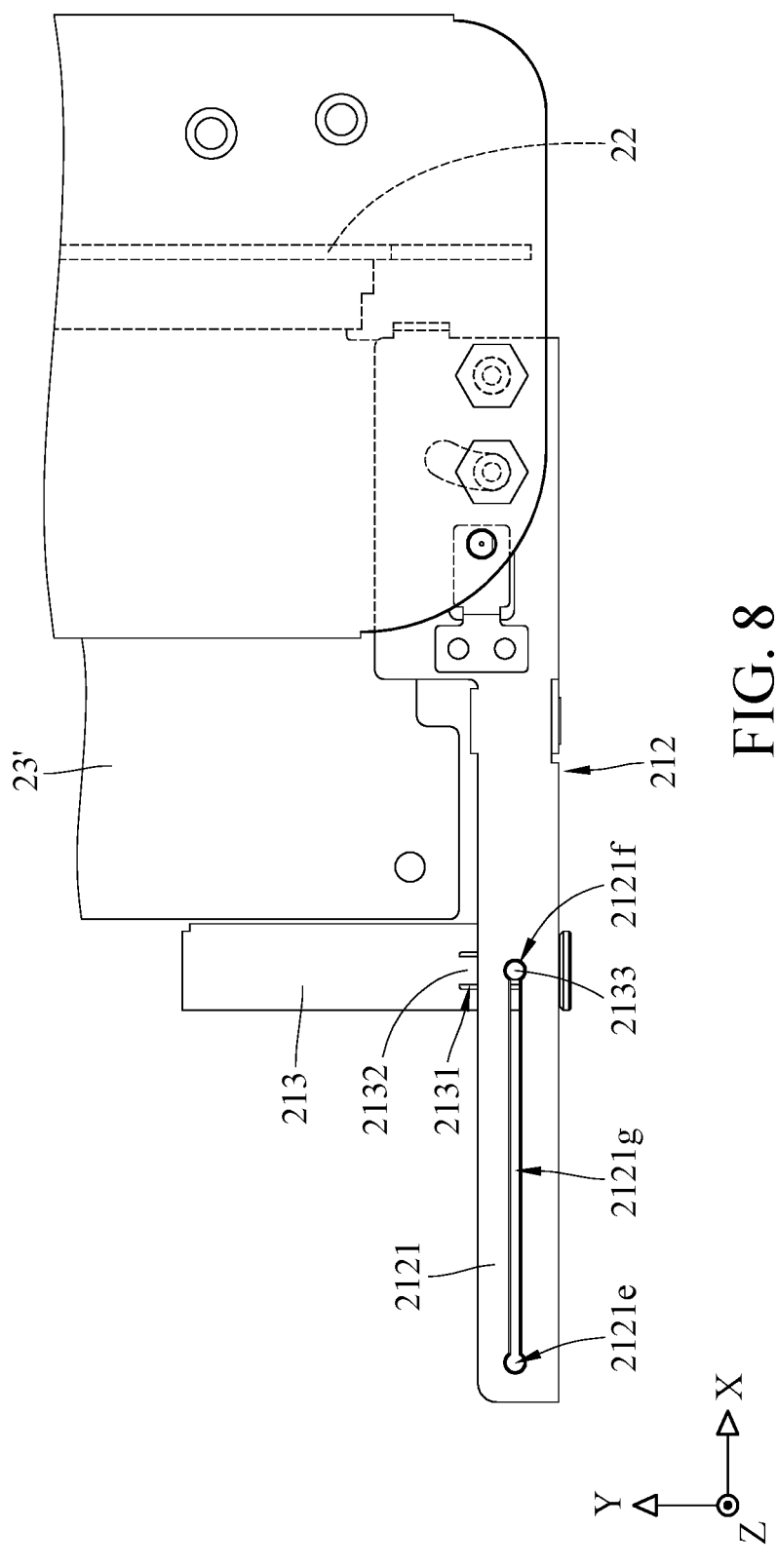
FIG. 8 is a partial top view of the expansion card module in FIG. 4 when the expansion card module supports another expansion card.

The stopper 213 has an opening 2131, an elastic arm 2132 and an engagement protrusion 2133. The elastic arm 2132 is movably located in the opening 2131, and the engagement protrusion 2133 is located on the elastic arm 2132. In this embodiment, the stopper 213 is movable between a first position (as shown in FIG. 4) and a second position (as shown in FIG. 8) along the straight line L, where the first position is located farther away from the riser card 22 than the second position. When the expansion card 23 inserted into the riser card 22 is the full-height expansion card 23, the stopper 213 is required to be in the first position located farther away from the riser card 22. At this moment, the engagement protrusion 2133 of the stopper 213 is engaged with the first engagement hole 2121e of the pivotable component 212, and the stopper 213 is located at one side of the full-height expansion card 23 located farther away from the riser card 22 and is spaced apart from the second side 232 of the expansion card 23 by a distance D, where the distance D allows the electrical connection portion 235 of the expansion card 23 to be slightly detached from the riser card due to vibrations, but it will not adversely affect the electrical connection between the electrical connection portion 235 of the expansion card 23 and the riser card 22. In this embodiment, the distance D between the stopper 213 and the second side 232 of the expansion card 23 is, for example, smaller than or equal to 75% of a height H of the electrical connection portion 235.

Figure 6:
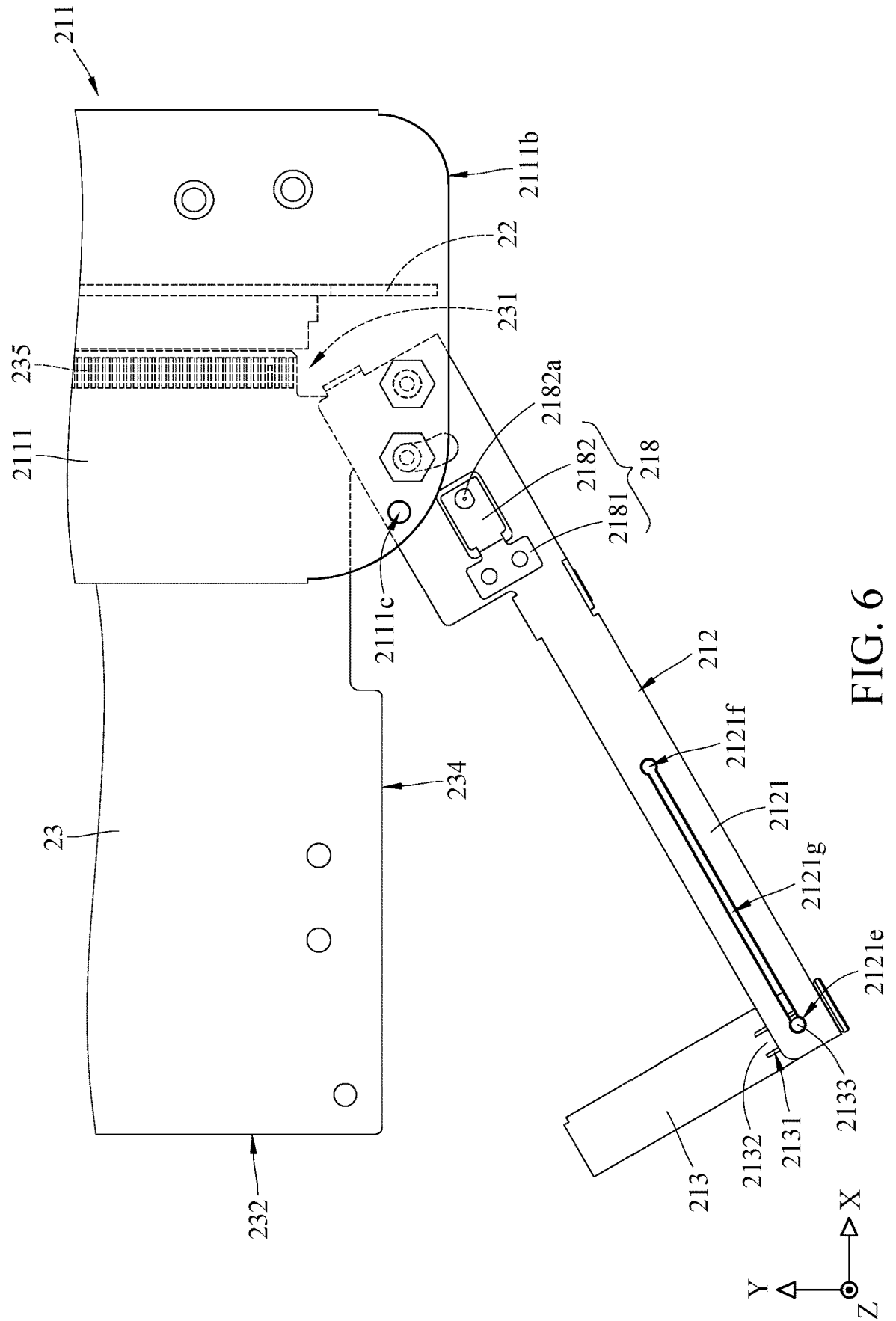
FIG. 6 is a partial top view of the expansion card module in FIG. 4 when a pivotable component is pivoted.
Figure 7:
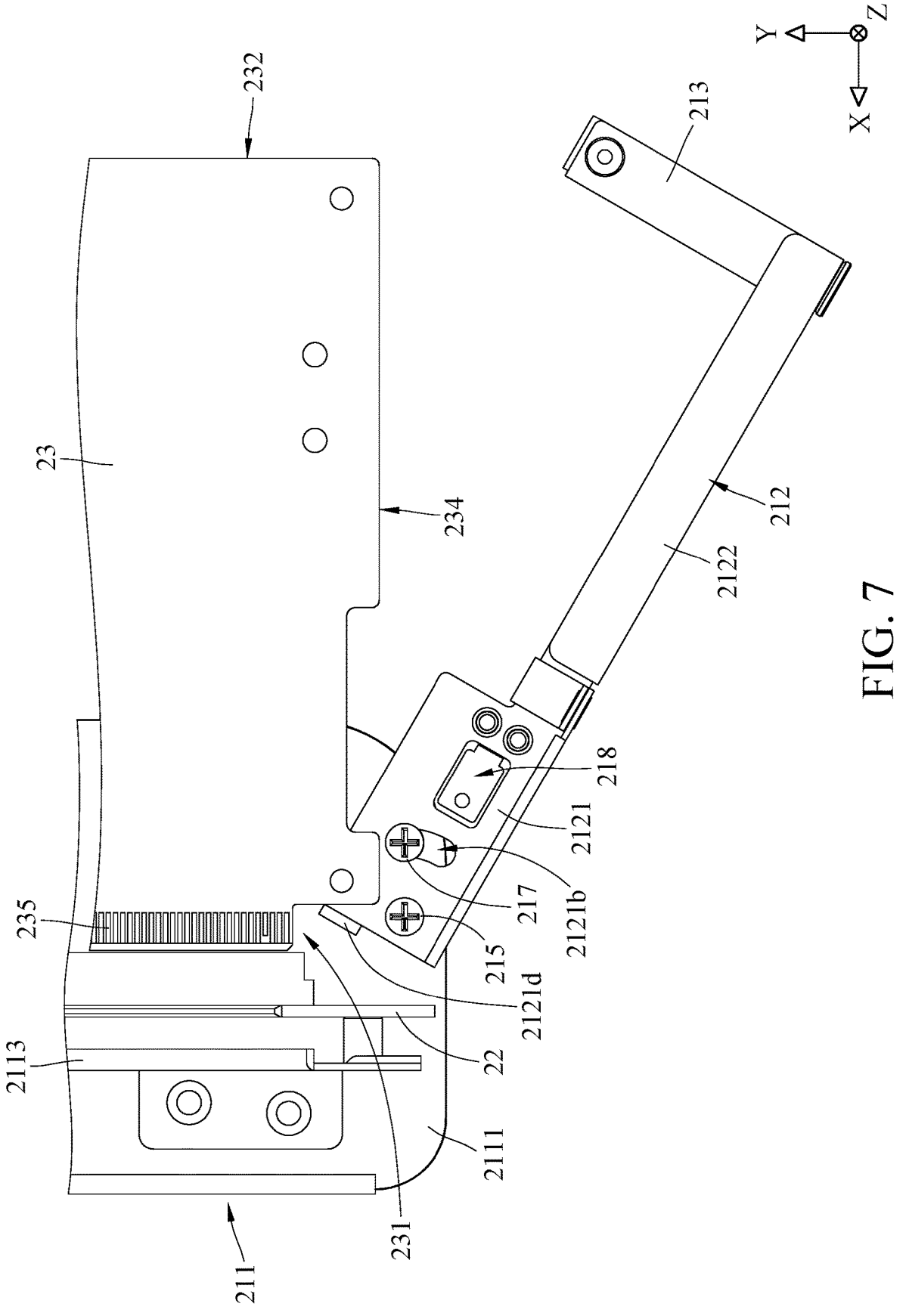
FIG. 7 is a partial bottom view of the expansion card module in FIG. 5 when the pivotable component is pivoted.

Then, the following paragraphs will illustrate the removal of the expansion card 23. Referring to FIGS. 6 and 7, FIG. 6 is a partial top view of the expansion card module 20 in FIG. 4 when the pivotable component 212 is pivoted, and FIG. 7 is a partial bottom view of the expansion card module 20 in FIG. 5 when the pivotable component 212 is pivoted.

When the expansion card 23 is required to be removed from the riser card 22, a finger may firstly press the elastic engagement component 218 downwards, such that the engagement protrusion 2182a of the elastic engagement component 218 is disengaged from the engagement hole 2111c of the top plate portion 2111 of the frame 211. At this moment, the pivotable component 212 is pivotable relative to the top plate portion 2111 of the frame 211. During the pivoting of the pivotable component 212 relative to the top plate portion 2111, the contact structure 2121d of the first horizontal plate 2121 of the pivotable component 212 pushes the expansion card 23, such that the electrical connection portion 235 of the expansion card 23 is detached from the riser card 22, and one end of the pivotable component 212 located farther away from the top plate portion 2111 of the frame 211 and the stopper 213 disposed thereon are moved away from the expansion card 23 simultaneously. As a result, the pivotable component 212 and the stopper 213 are deviated from the removal path of the expansion card 23, and thus the expansion card 23 can be directly removed.

In this embodiment, the pivotable component 212 is pivotably disposed on the frame 211, and the stopper 213 is movably disposed on the pivotable component 212, such that the pivotable component 212 is located aside the expansion card 23, and the stopper 213 is located at one side of the expansion card 23 located farther away from the riser card 22. Thus, during the removal and installation of the expansion card 23, the pivotable component 212 can be pivoted for moving the pivotable component 212 and the stopper 213 away from the removal and installation path of the expansion card 23, thereby reducing the chance that the expansion card 23 contacts the expansion card frame assembly 21 for preventing the expansion card 23 from being damaged.

In this embodiment, when the stopper 213 is located at one side of the expansion card 23 located farther away from the riser card 22, and the stopper 213 is spaced apart from the second side 232 of the expansion card 23 by a distance D. Such distance D not only prevents the electrical connection portion 235 of the expansion card 23 from being overly detached from the riser card 22 due to vibrations, but also prevents the stopper 213 from interfering with the expansion card 23 during the pivoting of the pivotable component 212. Furthermore, the distance D between the stopper 213 and the second side 232 of the expansion card 23 is smaller than or equal to 75% of the height H of the electrical connection portion 235, which further ensures the aforementioned efficacies.

In addition, the straight line L passing through the center of the first engagement hole 2121*e* and the center of the second engagement hole 2121*f* is located farther away from the expansion card 23 than the pivotal axis P of the pivotable component 212, such that a portion of the stopper 213 which covers the expansion card 23 can be reduced, and thus the distance D (as shown in FIG. 4) between the stopper 213 and the expansion card 23 can be reduced as much as possible, while the stopper 213 is ensured not to interfere with the expansion card 23 during the pivoting of the pivotable component 212.

Note that the straight line L passing through the center of the first engagement hole 2121*e* and the center of the second engagement hole 2121*f* is not restricted to being located farther away from the expansion card 23 than the pivotal axis P of the pivotable component 212, and the stopper 213 when being located at one side of the expansion card 23 located farther away from the riser card 22 is not restricted to being spaced apart from the expansion card 23 by a distance D. In some other embodiments, when there is no issue of the interference between the stopper and the expansion card during the pivoting of the pivotable component, the straight line passing through the center of the first engagement hole and the center of the second engagement hole may also pass through the pivotal axis of the pivotable component, or the straight line passing through the center of the first engagement hole and the center of the second engagement hole may be located closer to the expansion card than the pivotal axis of the pivotable component, and the stopper may be directly in contact with the expansion card when being located at one side of the expansion card located farther away from the riser card.

In this embodiment, the contact structure 2121*d* can push the expansion card 23 out of the riser card 22 during the pivoting of the pivotable component 212 so as to achieve the labor-saving effect. During the installation of the expansion card 23 to the riser card 22, the pivotable component is firstly in an opened state, and then the expansion card 23 is moved to press against the contact structure 2121*d* of the pivotable component 212 so as to pivot the pivotable component backwards. As a result, after the expansion card 23 is properly inserted into the riser card 22, the stopper 213 is located at one side of the expansion card 23 located farther away from the riser card 22 so as to stop the expansion card 23.

Note that the contact structure 2121*d* of the pivotable component 212 is an optional structure and may be omitted according to actual requirements.

Then, referring to FIG. 8, FIG. 8 is a partial top view of the expansion card module 20 in FIG. 4 when the expansion card module 20 supports another expansion card 23. When the expansion card required to be provided in the electronic device 1 is a half-height expansion card 23', the engagement protrusion 2133 of the stopper 213 is disengaged from the first engagement hole 2121*e* of the first horizontal plate 2121 of the pivotable component 212, and then the stopper 213 is moved to the second position from the first position. When the stopper 213 is in the second position, the engagement protrusion 2133 of the stopper 213 is engaged with the second engagement hole 2121*f* of the first horizontal plate 2121, and the stopper 213 is located at one side of the half-height expansion card 23' located farther away from the riser card 22 so as to stop the half-height expansion card 23'.

During the movement of the stopper 213 from the first position to the second position, the guide slot 2121*g* of the first horizontal plate 2121 can guide the engagement protrusion 2133 of the stopper 213. Note that the guide slot 2121*g* of the first horizontal plate 2121 is an optional structure and may be omitted according to actual requirements.

In addition, the opening 2131 and the elastic arm 2132 of the stopper 213 help the engagement protrusion 2133 to be engaged with or disengaged from the first engagement hole 2121*e* and the second engagement hole 2121*f* of the first horizontal plate 2121. Note that the opening 2131 and the elastic arm 2132 of the stopper 213 are optional structures and may be omitted according to actual requirements.

In this embodiment, the stopper 213 can be fixed in two different positions via the cooperation of the engagement protrusion 2133, the first engagement hole 2121*e* and the second engagement hole 2121*f* of the first horizontal plate 2121, but the disclosure is not limited thereto; in some other embodiments, the stopper and the first horizontal plate may be modified to have other suitable structures to fix the stopper in two different positions.

In this embodiment, the stopper 213 is slidably disposed on the pivotable component 212 to stop different sizes of the expansion card 23 and 23', but the disclosure is not limited thereto; in some other embodiments, the stopper may be pivotably disposed on the pivotable component so as to stop one specific size of the expansion card. Accordingly, the pivotable component may not have the slide channel.

In the aforementioned embodiment, the electronic device 1 is illustrated as a server, but the disclosure is not limited thereto; in some other embodiments, the electronic device may be a Network Attached Storage.

According to the expansion card frame assembly, the expansion card module and the electronic device as discussed in the above embodiment, the pivotable component is pivotably disposed on the frame, and the stopper is movably disposed on the pivotable component, such that the pivotable component is located aside the expansion card, and the stopper is located at one side of the expansion card located farther away from the riser card. Thus, during the removal and installation of the expansion card, the pivotable component can be pivoted for moving the pivotable component and the stopper away from the removal and installation path of the expansion card, thereby reducing the chance that the expansion card contacts the expansion card frame assembly for preventing the expansion card from being damaged.

In addition, when the stopper is located at one side of the expansion card located farther away from the riser card, and the stopper is spaced apart from the expansion card by a distance. Such distance not only prevents the expansion card from being overly detached from the riser card due to vibrations, but also prevents the stopper from interfering with the expansion card during the pivoting of the pivotable component.

Moreover, the straight line passing through the center of the first engagement hole and the center of the second engagement hole is located farther away from the expansion card than the pivotal axis of the pivotable component, such that a portion of the stopper which covers the expansion card can be reduced, and thus the distance between the stopper and the expansion card can be reduced as much as possible, while the stopper is ensured not to interfere with the expansion during the pivoting of the pivotable component.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An expansion card frame assembly, configured to support a riser card and an expansion card, the expansion card frame assembly comprising:

a frame, comprising a top plate portion, a front frame portion and a side frame portion, wherein the top plate portion has a first side and a second side located opposite to each other, the front frame portion is connected to the first side of the top plate portion, the side frame portion is connected to the top plate portion and located between the first side and the second side, the side frame portion is configured to support the riser card, and the front frame portion is configured to support the expansion card, wherein the expansion card is configured to be inserted into the riser card;

a pivotable component, pivotably disposed on the second side of the top plate portion of the frame and located opposite to the front frame portion, wherein a pivotal axis of the pivotable component is perpendicular to the top plate portion, and the pivotable component is configured to be located aside the expansion card; and a stopper, movably disposed on the pivotable component and located opposite to the side frame portion, wherein the stopper is configured to be located at one side of the expansion card which is located farther away from the riser card;

wherein the pivotable component has a first engagement hole and a second engagement hole, the stopper has an engagement protrusion, the engagement protrusion is engaged with the first engagement hole or the second engagement hole, a straight line is defined to pass through a center of the first engagement hole and a center of the second engagement hole, and the pivotal axis of the pivotable component is located between a rear edge of the expansion card and the straight line in a direction orthogonal to the front frame portion.

2. The expansion card frame assembly according to claim 1, wherein the stopper is slidably disposed on the pivotable component so as to be slidable between a first position and a second position; when the stopper is in the first position, the stopper is configured to be located at one side of the expansion card of full height which is located farther away from the riser card; when the stopper is in the second position, the stopper is configured to be located at one side of the expansion card of half height which is located farther away from the riser card.

3. The expansion card frame assembly according to claim 2, wherein when the stopper is in the first position, the engagement protrusion of the stopper is engaged with the first engagement hole of the pivotable component; when the stopper is in the second position, the engagement protrusion of the stopper is engaged with the second engagement hole of the pivotable component.

4. The expansion card frame assembly according to claim 3, wherein the straight line is configured to be located farther away from the expansion card than the pivotal axis of the pivotable component.

5. The expansion card frame assembly according to claim 3, wherein the pivotable component has a guide slot, and two opposite ends of the guide slot respectively communicate with the first engagement hole and the second engagement hole.

6. The expansion card frame assembly according to claim 3, wherein the stopper further has an opening and an elastic arm, the elastic arm is movably located in the opening, and the engagement protrusion is located on the elastic arm.

7. The expansion card frame assembly according to claim 1, further comprising a positioning component, wherein the positioning component is fixed to the frame, the pivotable component has a curved slot, and the positioning component is partially located in the curved slot.

8. The expansion card frame assembly according to claim 1, further comprising an elastic engagement component, wherein the pivotable component has an opening, the elastic engagement component is fixed to the pivotable component and is partially located in the opening, the frame has an engagement hole, and the elastic engagement component is detachably engaged with the engagement hole.

9. The expansion card frame assembly according to claim 1, wherein the pivotable component has a contact structure, the contact structure and the stopper are configured to be located at two opposite sides of the expansion card, and the contact structure is configured to be in contact with the expansion card.

10. The expansion card frame assembly according to claim 1, wherein the frame further comprises a positioning portion, the positioning portion is connected to the front frame portion and extends towards a direction away from the second side, the positioning portion is configured to support the expansion card.

11. An expansion card module, comprising:

an expansion card frame assembly, comprising:

a frame, comprising a top plate portion, a front frame portion and a side frame portion, wherein the top plate portion has a first side and a second side located opposite to each other, the front frame portion is connected to the first side of the top plate portion, the side frame portion is connected to the top plate portion and located between the first side and the second side;

a pivotable component, pivotably disposed on the second side of the top plate portion of the frame and located opposite to the front frame portion, wherein a pivotal axis of the pivotable component is perpendicular to the top plate portion; and a stopper, movably disposed on the pivotable component and located opposite to the side frame portion;

a riser card, supported by the side frame portion of the frame; and an expansion card, supported by the front frame portion and inserted into the riser card, wherein the pivotable component is located aside the expansion card, and the stopper is located at one side of the expansion card located farther away from the riser card, wherein the pivotable component has a first engagement hole and a second engagement hole, the stopper has an engagement protrusion, the engagement protrusion is engaged with the first engagement hole or the second engagement hole, a straight line is defined to pass through a center of the first engagement hole and a center of the second engagement hole, and the pivotal axis of the pivotable component is located between a rear edge of the expansion card and the straight line in a direction orthogonal to the front frame portion.

12. The expansion card module according to claim 11, wherein the expansion card has a first side and a second side located opposite to each other, the first side of the expansion card is inserted into the riser card, and the stopper and the second side of the expansion card are spaced apart from each other by a distance.

13. The expansion card module according to claim 12, wherein the expansion card has an electrical connection portion, the electrical connection portion is located at the first side and inserted into the riser card, and the distance between the stopper and the second side of the expansion card is smaller than or equal to 75% of a height of the electrical connection portion.

14. The expansion card module according to claim 11, wherein the stopper is slidably disposed on the pivotable component so as to be slidable between a first position and a second position, the expansion card is a full-height or half-height expansion card; when the stopper is in the first position, the stopper is located at one side of the full-height expansion card which is located farther away from the riser card; when the stopper is in the second position, the stopper is located at one side of the half-height expansion card which is located farther away from the riser card.

15. The expansion card module according to claim 14, wherein when the stopper is in the first position, the engagement protrusion of the stopper is engaged with the first engagement hole of the pivotable component; when the stopper is in the second position, the engagement protrusion of the stopper is engaged with the second engagement hole of the pivotable component.

16. The expansion card module according to claim 15, wherein the straight line is located farther away from the expansion card than the pivotal axis of the pivotable component.

17. The expansion card module according to claim 15, wherein the pivotable component has a guide slot, and two opposite ends of the guide slot respectively communicate with the first engagement hole and the second engagement hole.

18. The expansion card module according to claim 11, wherein the expansion card frame assembly further comprises a positioning component, the positioning component is fixed to the frame, the pivotable component has a curved slot, and the positioning component is partially located in the curved slot.

19. The expansion card module according to claim 11, wherein the expansion card frame assembly further comprises an elastic engagement component, the pivotable component has an opening, the elastic engagement component is fixed to the pivotable component and is partially located in the opening, the frame has an engagement hole, and the elastic engagement component is detachably engaged with the engagement hole.

20. An electronic device, comprising:
a casing, having an accommodation space;
a motherboard, located in the accommodation space of the casing; and
an expansion card module, mounted on the motherboard and comprising:
    an expansion card frame assembly, comprising:
        a frame, comprising a top plate portion, a front frame portion and a side frame portion, wherein the top plate portion has a first side and a second side located opposite to each other, the front frame portion is connected to the first side of the top plate portion, the side frame portion is connected to the top plate portion and located between the first side and the second side;
        a pivotable component, pivotably disposed on the second side of the top plate portion of the frame and located opposite to the front frame portion, wherein a pivotal axis of the pivotable component is perpendicular to the top plate portion; and
        a stopper, movably disposed on the pivotable component and located opposite to the side frame portion;
        a riser card, supported by the side frame portion of the frame; and
        an expansion card, supported by the front frame portion and inserted into the riser card, wherein the pivotable component is located aside the expansion card, and the stopper is located at one side of the expansion card located farther away from the riser card, wherein the pivotable component has a first engagement hole and a second engagement hole, the stopper has an engagement protrusion, the engagement protrusion is engaged with the first engagement hole or the second engagement hole, a straight line is defined to pass through a center of the first engagement hole and a center of the second engagement hole, and the pivotal axis of the pivotable component is located between a rear edge of the expansion card and the straight line in a direction orthogonal to the front frame portion.

* * * * *